(12) United States Patent
Luo et al.

(10) Patent No.: US 11,385,962 B2
(45) Date of Patent: Jul. 12, 2022

(54) METHOD AND APPARATUS FOR ERROR CORRECTION ENCODING COMPRESSED DATA

(71) Applicant: Sage Microelectronics Corporation, Campbell, CA (US)

(72) Inventors: Jianjun Luo, Campbell, CA (US); Hailuan Liu, Zhejiang (CN); Huayue Chen, Zhejiang (CN); Chris Tsu, Campbell, CA (US)

(73) Assignee: Sage Microelectronics Corporation, Campbell, CA (US)

( * ) Notice: Subject to any disclaimer, the term of this patent is extended or adjusted under 35 U.S.C. 154(b) by 10 days.

(21) Appl. No.: 17/089,729

(22) Filed: Nov. 5, 2020

(65) Prior Publication Data

US 2022/0138044 A1   May 5, 2022

(51) Int. Cl.
| | | |
|---|---|---|
| G06F 11/00 | (2006.01) | |
| G06F 11/10 | (2006.01) | |
| H03M 7/40 | (2006.01) | |

(52) U.S. Cl.
CPC ........... *G06F 11/1068* (2013.01); *H03M 7/40* (2013.01)

(58) Field of Classification Search
None
See application file for complete search history.

(56) References Cited

U.S. PATENT DOCUMENTS

| | | | | |
|---|---|---|---|---|
| 9,838,045 B1* | 12/2017 | Bennett | ............. | H03M 13/3761 |
| 11,057,060 B1* | 7/2021 | Luo | ..................... | G06F 11/1072 |
| 11,204,834 B1* | 12/2021 | Luo | ........................ | G06F 3/0679 |
| 2008/0282098 A1* | 11/2008 | Ito | ........................ | G06F 11/1044 |
| | | | | 714/766 |
| 2010/0061465 A1* | 3/2010 | Limberg | ............ | H04N 21/2383 |
| | | | | 375/E7.279 |
| 2012/0300791 A1* | 11/2012 | Kang | ...................... | H04L 7/042 |
| | | | | 370/474 |
| 2013/0147645 A1* | 6/2013 | Wang | ................ | H03M 13/1595 |
| | | | | 341/94 |
| 2013/0294447 A1* | 11/2013 | Myung | ................... | H04L 69/40 |
| | | | | 370/389 |
| 2015/0097973 A1* | 4/2015 | LeBeaux | ............ | H04N 1/00214 |
| | | | | 348/207.1 |
| 2019/0266460 A1* | 8/2019 | Ushiki | ............. | G06K 19/06037 |
| 2019/0370620 A1* | 12/2019 | Shen | ................ | G06K 19/06056 |

OTHER PUBLICATIONS

Lim SH, Park KW. Compression-Assisted Adaptive ECC and RAID Scattering for NAND Flash Storage Devices. Sensors (Basel). 2020;20(10):2952. Published May 22, 2020. doi:10.3390/s20102952 (Year: 2020).*
L. Chen, Y. Cao and Z. Zhang, "Free ECC: An efficient error protection for compressed last-level caches," 2013 IEEE 31st International Conference on Computer Design (ICCD), 2013, pp. 278-285, doi: 10.1109/ICCD.2013.6657054. (Year: 2013).*

* cited by examiner

*Primary Examiner* — Daniel F. McMahon
(74) *Attorney, Agent, or Firm* — Joe Zheng

(57) ABSTRACT

Designs of controllers for flash memory array are described. A controller is designed to form data packs of a predefined size with compressed data segments in different sizes. The data packs are encoded with ECC in two dimensions. When the data packs are read out, the ECC is applied in two dimensions to detect and correct errors that can be corrected by the ECC.

20 Claims, 10 Drawing Sheets

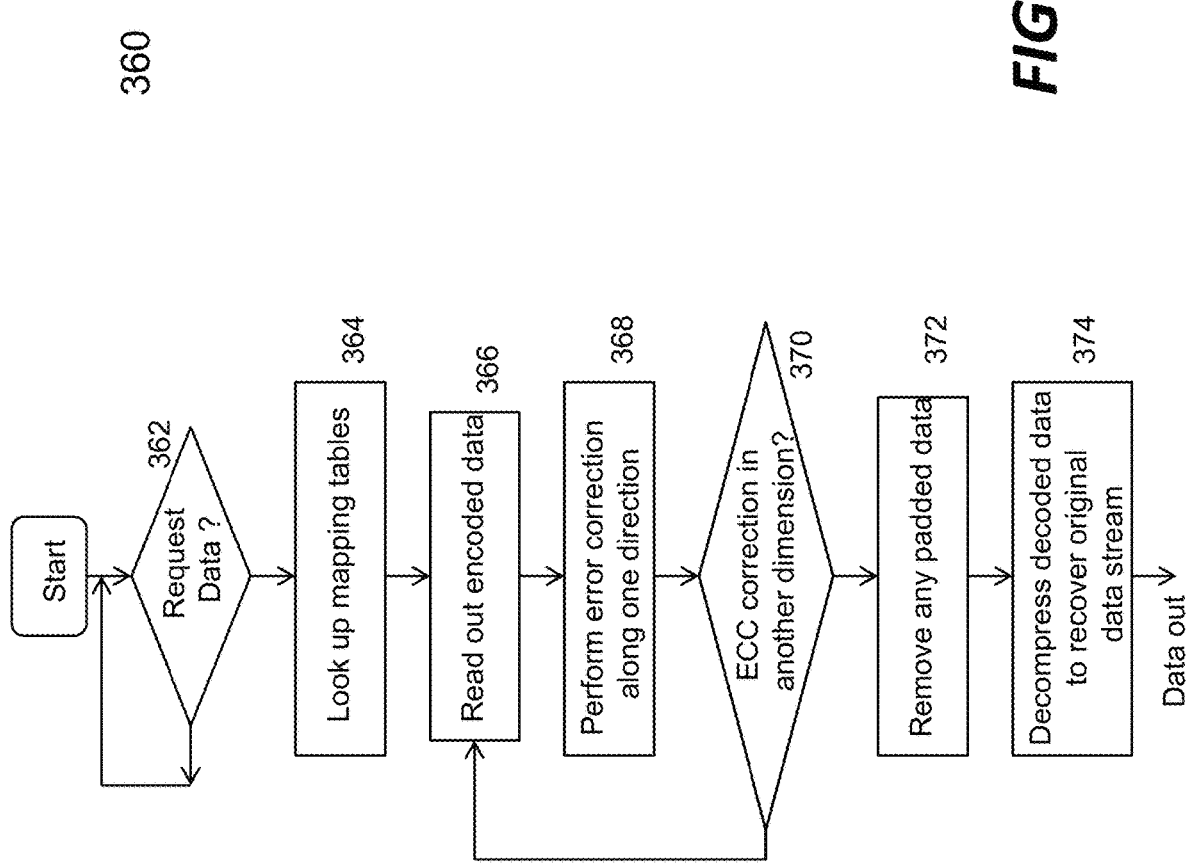

METHOD AND APPARATUS FOR ERROR CORRECTION ENCODING COMPRESSED DATA

BACKGROUND OF THE INVENTION

Field of Invention

The invention generally is related to the area of data management and integrity, and more particularly related to error correction in compressed data, and method and apparatus for error corrections in flash memory.

Related Art

Various electronic data is being created every moment. Retaining or storing the data is increasingly demanded than ever. Various technologies and devices have been developed to store the data. Data storage often includes hardware components and recording media to retain the digital data. Examples of the recording media include punch cards, hard drive disks, floppy disks, magnetic tapes, optical discs and semiconductors. Among the semiconductor-based recording media, flash memory is a type of nonvolatile memory that can be electrically erased and reprogrammed and is being used in many applications. One common use of the flash memory is the solid state drives (SSD) that can hold enormous amounts of data in very small size, enabling various kinds of new applications for many industries as well as consumer uses.

One of the problems with the flash memory is the data errors that may be caused by memory wear, read disturb error, program disturb error, over-programming error, retention error and others. These errors are becoming increasingly concerned with the continued scaling of NAND flash technology and advancements in multi-level cell (MLC) technologies, especially with nanometer-regime process geometries. Error Correction Code or Error Correcting Code (ECC) processing is commonly used with NAND flash memory to detect and correct bit errors that may occur with the memory. However, the flash memory bit error rates increase with the number of program/erase cycles and the scaling of technology. Therefore there is a need for more error detection and correction (EDC) schemes that can be implemented efficiently in flash memory. Without adding additional costs or impacting operation performance, there is another need for a technique that can be easily used to support higher raw bit error rates and enhance the lifespan of NAND flash memory.

To increase the storage capacity, data is preferably compressed before they are stored on a media. To apply an EDC process to the compressed data more efficiently, there is a further need for a technique for organizing or preprocessing the compressed data before applying an EDC process.

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention generally pertains to method and apparatus for error detection and correction (EDC) for compressed data. According to one aspect of the present invention, data to be transmitted or stored in an unreliable environment is first compressed in accordance with a data compression scheme. The compressed data segments are processed to form data stacks with fixed sizes, where the fixed sizes are related to a page size of a flash memory and error correction (ECC) codes or words are encoded in one or more dimensions. The compressed data segments are fully recovered after error detections and corrections are applied. Subsequently the recovered compressed data is uncompressed to recover the original data.

According to another aspect of the present invention, the compressed data segments are mapped into data packs in a predefined size and appended with spaces for a set of computed ECCs (encoding) along one dimension. The data packs are further respectively encoded with another set of computed ECCs along a different dimension to facilitate error corrections in multiple dimensions when the data needs recovered.

According to still another aspect of the present invention, different approaches are used to generate the data packs in equal sizes by appending known values to, stitching or concatenating the compressed data segments.

According to still another aspect of the present invention, a flash controller is designed to execute a set of firmware to generate the data packs in equal sizes and encode the data in multiple dimensions.

The present invention may be implemented as an apparatus, a method, and a part of system. Different implementations may yield different benefits, objects and advantages. In one embodiment, the present invention is an apparatus for storing compressed data, the apparatus comprises: an interface for receiving a data stream from a host device; a memory space for maintaining a set of firmware and one or more mapping tables; a processor, coupled to the memory space, executing the firmware to perform operations of: compressing the data stream into a plurality of data segments in accordance with a compression algorithm, wherein the data segments are in different lengths; forming a plurality of data packs in a predefined first length with the data segments, wherein the data packs are in two dimensions; and encoding each of the data packs with a first predefined Error Correcting Code (ECC) scheme along a first dimension.

In another embodiment, the present invention is a method for storing compressed data, the method comprises: receiving a data stream from an interface communicating with a host device; compressing the data stream into a plurality of data segments in accordance with a compression algorithm, wherein the data segments are in different lengths; forming a plurality of data packs of a predefined first length with the data segments; encoding each of the data packs with a first predefined Error Correcting Code (ECC) scheme along a first dimension; encoding each of data bits across each of the data packs with a second predefined ECC scheme along a second dimension; and creating an array of data including the data packs along with redundant bits from the first predefined ECC and the second predefined ECC.

There are many other objects, together with the foregoing attained in the exercise of the invention in the following description and resulting in the embodiment illustrated in the accompanying drawings.

BRIEF DESCRIPTION OF THE FIGURES

These and other features, aspects, and advantages of the present invention will be better understood with regard to the following description, appended claims, and accompanying drawings where:

FIG. 3E shows a flowchart or process of correcting errors in stored data according to one embodiment of the present invention.

DETAILED DESCRIPTION OF THE INVENTION

The detailed description of the invention is presented largely in terms of procedures, steps, logic blocks, processing, and other symbolic representations that directly or indirectly resemble the operations of communication or storage devices that may or may not be coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
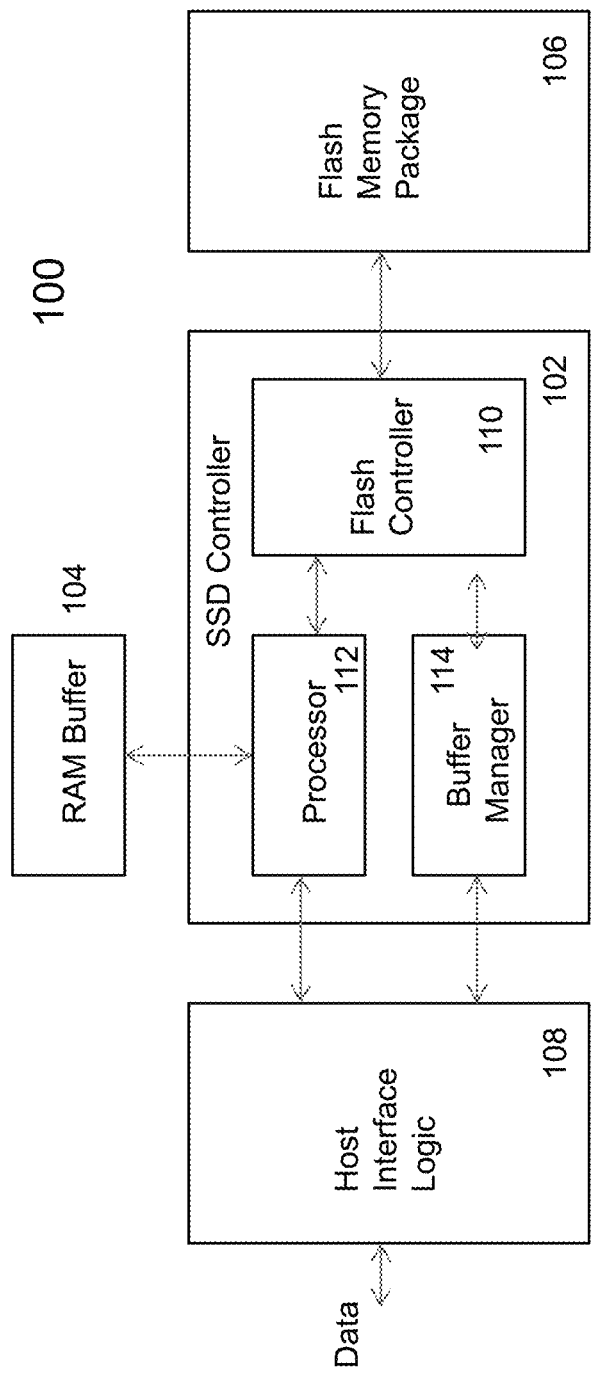
FIG. 1 shows an exemplary architecture of Solid State Device (SSD) that includes an SSD controller, a RAM buffer, a flash memory package and an interface.

One of the important objects, advantages and benefits in the present invention is to improve the data integrity and the reliability of data in communication or memory cells, especially in NAND flash memory cells. FIG. 1 shows an exemplary architecture of Solid State Device (SSD) 100 that includes an SSD controller 102, a RAM buffer 104, a flash memory package 106 and an interface 108. The SSD controller 102 manages the data stored on flash memory package 106 and communicates with a host device. When a host system or device needs to read data from or write data into the SSD 100, it will communicate with the SSD controller 102. Through the interface 108 (e.g., eSATA, USB, eMMC, CF cards, SD/micro SD cards and PCIe), data from a host device (not shown) is coupled in, processed in the SSD controller 102 and stored in the recording media, namely the flash memory package or arrays 106. To keep track of how the data is organized on the media 106, at least one mapping table is maintained by the SSD controller 102, where the mapping table records where and how the data or data bits are stored in the flash memory arrays 106. In some high-performance SSD, the RAM buffer 104 is provided to increase the amount of mapping data immediately available and to cache data that has been written by the host device.

The SSD controller 102 is shown to include a flash controller 110, a processor 112 and a buffer manager 114. Under the processor 112, the controller 110 and the buffer manager 114 execute some firmware to manage where and how the data is stored exactly in the flash memory arrays 106, and from which the stored data can be selectively located and read out when a host needs some or all of the data. According to one embodiment, one version of the firmware is designed to implement the organization of the compressed data for storage in the flash 106, another version of the firmware is designed to embed error correction codes in the stored data, where possible errors caused to the stored data can be efficiently detected and corrected when there is a need for the data.

Figure 2A:
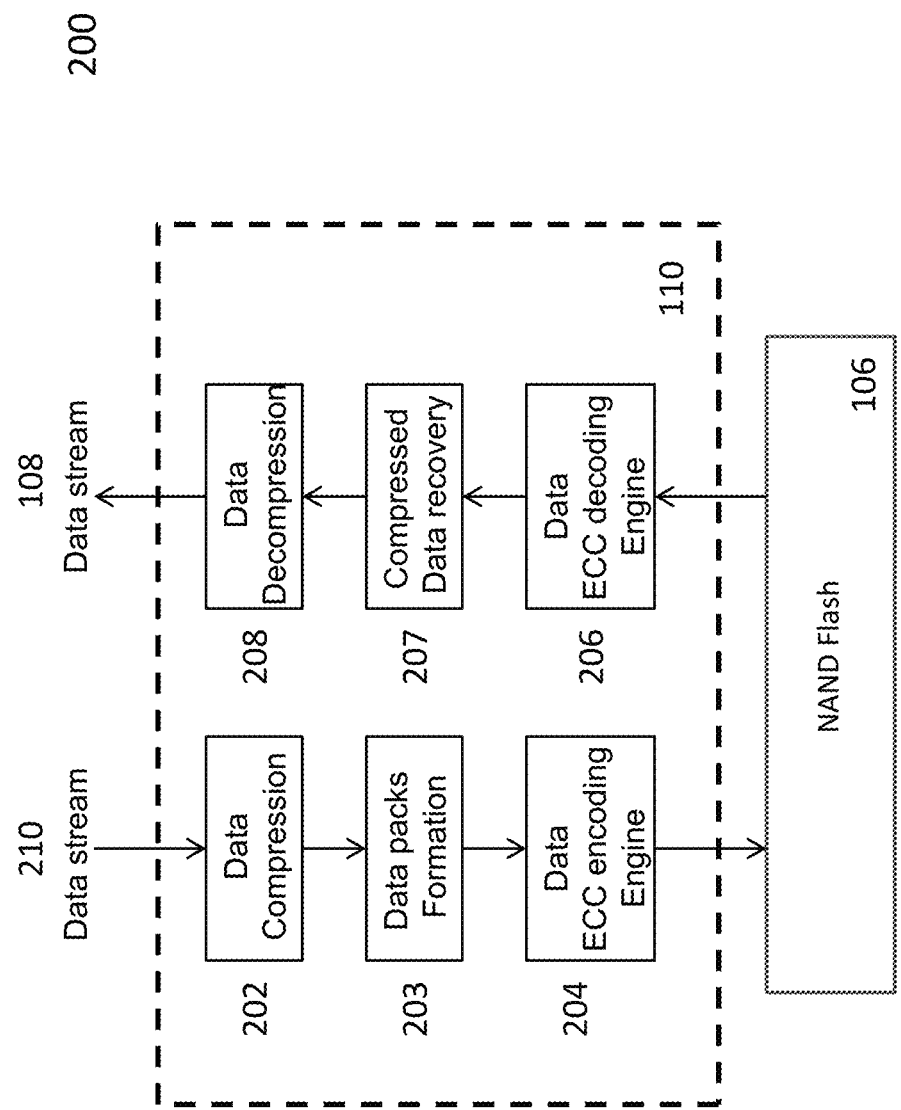
FIG. 2A shows a logic block diagram of an exemplary flash controller according to one embodiment of the present invention.

FIG. 2A shows an exemplary logic block diagram 200 that may be implemented in the flash controller 110 or processor 112 according to one embodiment of the present invention. A data compression engine 202 is provided to compress an incoming data stream 210. Data compression is a reduction in the number of bits needed to represent data. Compressing data can save storage capacity, speed up file transfer, and decrease costs for storage hardware and network bandwidth. Compression is performed in accordance with a formula or algorithm to determine how to shrink the size of the data. Different algorithms may result in different compressions. Those skilled in the art shall know that there are many compression algorithms in the art. Accordingly the compression details will not be further described herein. After the data stream 210 is compressed, the data compression engine 202 generates a plurality of data segments in different lengths.

A data pack formation engine 203 is provided to form data packs from the data segments. Depending on how much each of the original data segments can be compressed, the (compressed) data segments are often in different lengths. As will be described below, it is preferable to have all the data lengths in equal lengths before they are sent to a data encoding engine 204 for adding the ECC codes or redundant data bits. The data pack formation engine 203 produces a plurality of data packs. In one embodiment, each data pack is a linear array of data bits in a predefined length (e.g., 8 KB or 16 KB long). As will be further described below, a data pack is generated based on one or more data segments with or without padded bits.

The data packs are then encoded with a predefined ECC scheme in the encoding engine 204. The encoded data is then stored in the flash memory 106. When the stored data is requested by a host and needs to be read out from the flash memory 106, the stored data is first located in the flash memory 106 per the mapping tables (not shown) and decoded with the ECC in the decoding engine 206. The decoded data from the decoding engine 206 is then processed in a data recovery engine 207 to recover the data segments, namely only the compressed data. The decompression engine 208 is provided to decompress the data segments to recover the original data stream 108.

One of the objectives, advantages and benefits in the present invention is to encode compressed data. It should be appreciated to those skilled in the art that the same encoding and decoding technique may be equally applied to uncompressed data if needed. Because of the inherently unreliable nature of NAND memory, data stored in NAND Flash may not hold its correct values, namely the data bits flipped unexpectedly. As the quantity of data bits influenced by this statistically small and very much portrayed, processors or flash controllers can utilize a coordinating level of the ECC to accomplish the required dependability and reliability.

It is known in the art that error correcting code (ECC) is an encoding scheme that transmits data in binary numbers in such a way that the data can be recovered even if some bits are erroneously flipped. Various ECC methods are used in practically all cases of data transmission, especially in data storage where ECCs defend against data corruption. In implementation, an ECC scheme is an algorithm for expressing a sequence of extra numbers to be embedded in or appended to a sequence of data bits such that a limited number of the data bits unexpectedly flipped (e.g., from "0" to "1" or "1" to "0") can be detected and corrected based on the extra numbers. When data is stored in nonvolatile memory, it is crucial to have the mechanism that can detect and correct a certain number of errors.

Error correction code (ECC) can encode k data bits to become a block of n bits called a code word. A block code (linear or not) works efficiently with a fixed data length, takes k data bits and computes m parity bits, where m=n−k. In general, the larger m is, the more errors the ECC may be able to correct. To maximize the data storage capacity in a given flash memory array, the length m is designed practically limited.

Figure 2B:
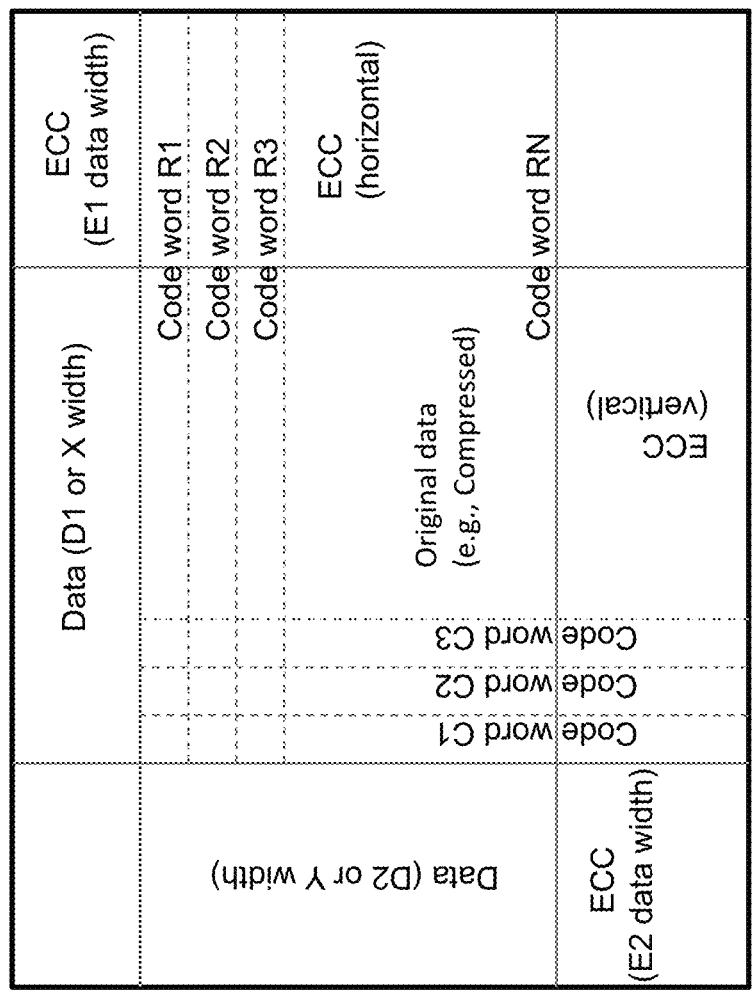
FIG. 2B shows an example of using a predefined ECC in two dimensions.

FIG. 2B shows an example of applying the ECC in two dimensions or horizontal and vertical directions. Different from the traditional use of ECC that is simply applied to a sequence of data bits once, the ECC is applied across the data horizontally first and then vertically, or vice versa, according to one embodiment. In operation, the original data along the horizontal direction is encoded first with a predefined ECC scheme, resulting rows of code words R1, R2, ... RN (original data+ECC codes or redundant bits).

Figure 2C:
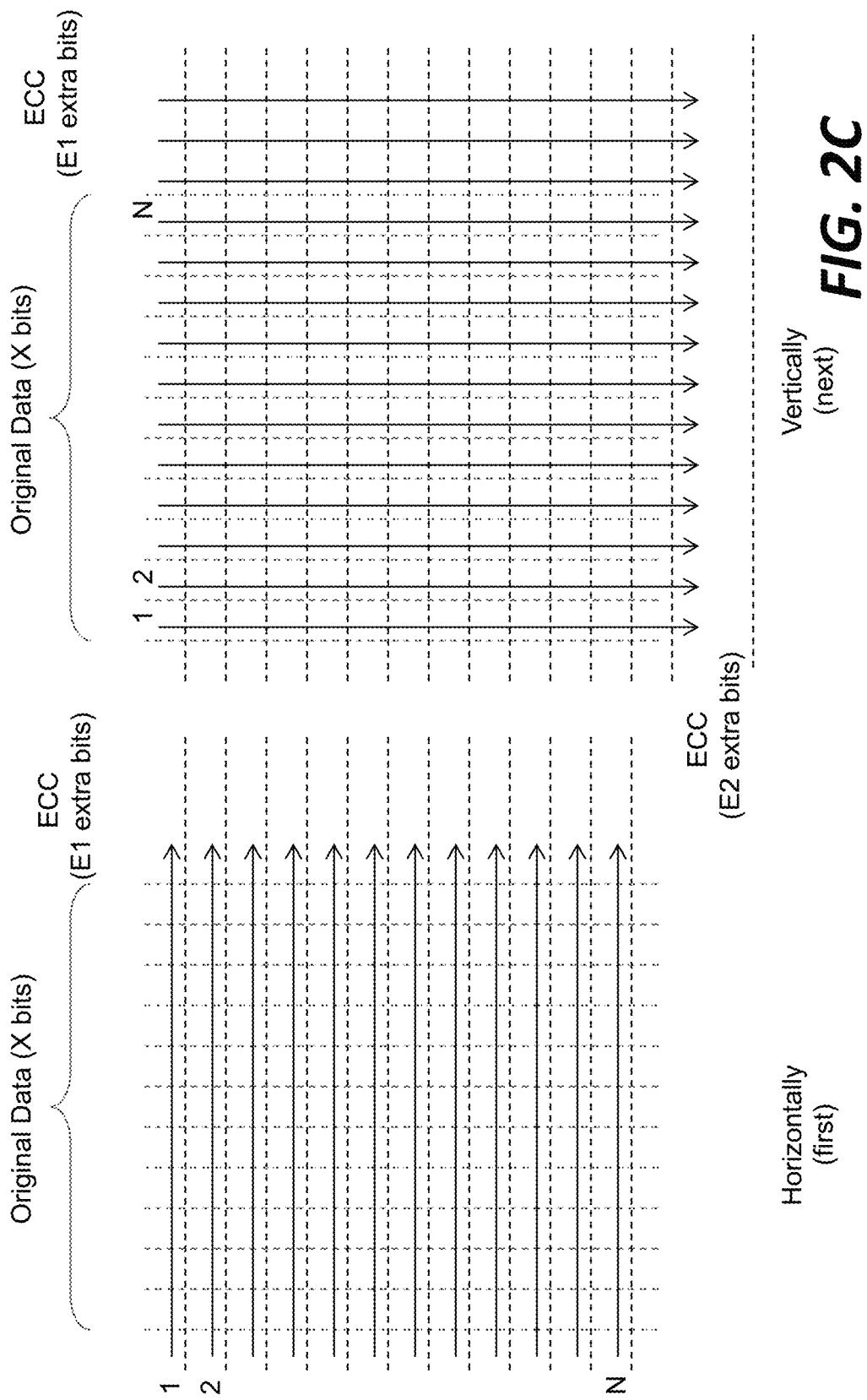
FIG. 2C shows one exemplary way of encoding the original data bits with ECC according to one embodiment of the present invention.

According to one embodiment, an ECC scheme based on Hamming code is used. Hamming code is a set of error-correction codes that can be used to detect and correct the errors that are introduced to the encoded data. For example, if the number of data bits is 7, then the number of redundant bits is 4, satisfying $2^r \geq m+r+1$, where r =redundant bit and m=data bit. After the data bits are encoded with the redundant bits, the code word is 11 bits in length. FIG. 2C shows that, in each row, there are D1 bits or X in length and E1 bits for the redundant bits. Those skilled in the art can appreciate that these E1 redundant bits may be encoded in the D1 data bits even though they are collectively and graphically shown at the end of the data bits.

There are now N rows of code words after the horizontal encoding. A predefined ECC scheme is next applied vertically. Although the ECC scheme applied vertically does not have to be the one that has been applied horizontally, it is assumed herein that the ECC applied is the same vertically or horizontally. One difference is that the data bits along the vertical direction ($2^{nd}$ dimension) are not from the same data pack. These data bits are from the rows of the code words and encoded with a set of redundant bits per the ECC scheme. Those skilled in the art shall understand that the operation as described above may be applied vertically first then horizontally.

Figure 2D:
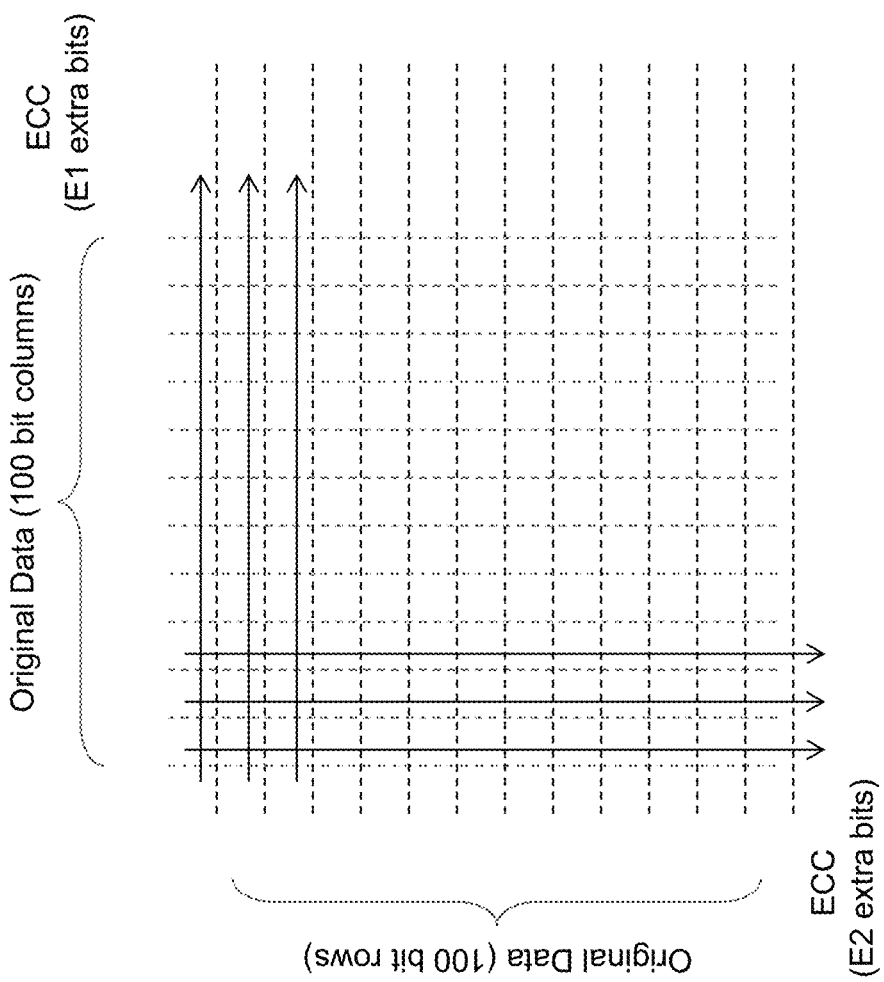
FIG. 2D shows another exemplary way of encoding the original data bits with ECC according to one embodiment of the present invention.

FIG. 2D shows another way of encoding the original data bits with ECC according to one embodiment of the present invention. In operation, a predefined ECC operation is applied to horizontal and vertical data bits simultaneously or one after another. In the case that the redundant bits are embedded in the original data bits, they can be addressed to the end of a line of data bits to ensure that the original data bits get encoded with the ECC.

Figure 3A:
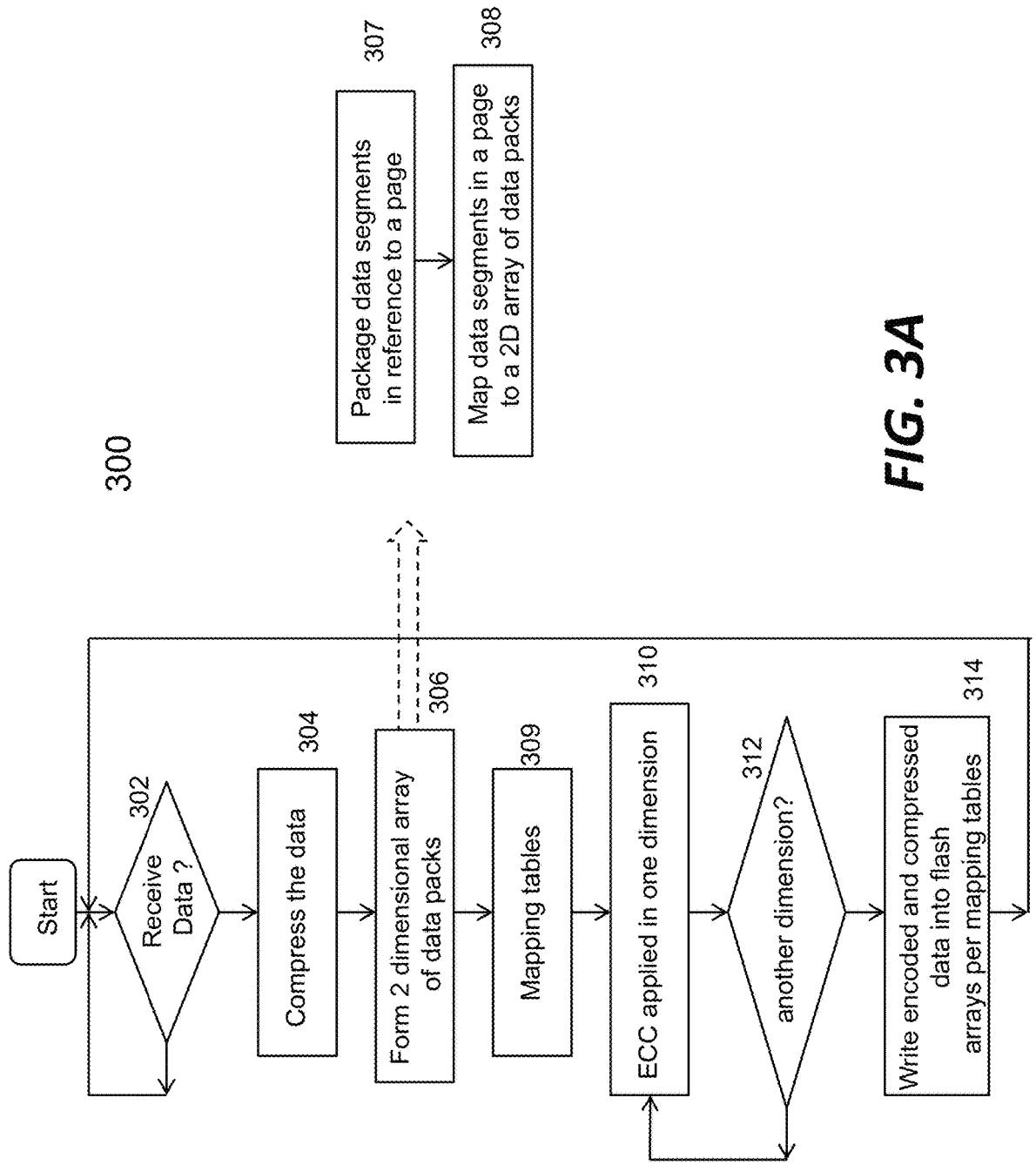
FIG. 3A shows a flowchart or process of writing a data stream into a flash array according to one embodiment of the present invention.

FIG. 3A shows a flowchart or process 300 of writing a data stream into a flash array according to one embodiment of the present invention. The flowchart 300 may be better appreciated in view of FIGS. 2A-2D and implemented in hardware or in combination of software (e.g., firmware) and hardware. The flowchart 300 starts when a data stream is received or coupled in at 302. The data stream may be pertaining to a file, a photo and an audio/video from a host device (e.g., a laptop computer). When a user desires to store a file into a storage device (e.g., SSD), the data stream is created.

At 304, the data stream is initially compressed in accordance with a compression scheme. There are many data compression schemes that may be used. An example of such a compression scheme is LZ77 from "A Universal Algorithm for Sequential Data Compression", IEEE TRANSACTIONS ON INFORMATION THEORY, VOL. IT-23, No. 3, May 1977. Another example of such a compression scheme is Huffman coding (https://en.wikipedia.org/wiki/Huffman_coding), both are hereby incorporated by reference. After the data stream is compressed, the process 300 goes to 306, where a two dimensional array of data packs from the compressed data are formed in reference to a chosen ECC scheme (e.g., Hamming code).

As used herein, a two dimensional array of data packs is a collection of rows of data in a fixed length. According to one embodiment, the collection of rows of data just fit into a page in a flash memory while a collection of pages just fits into a block in a flash memory. It should be noted that a block is the smallest unit in a flash memory that can be erased while a page is the smallest unit in the flash memory that can be programmed (i.e., written therein). The common block size is typically in a range of 4-8 MB in size and the common page size is typically in a range of 8-16 KB in size. The architecture of NAND flash memories dictates that data is written or read in pages, typically between 4 KiB and 16 KiB in size, but can only be erased at the level of entire blocks consisting of multiple pages and often MB in size.

Figure 3B:
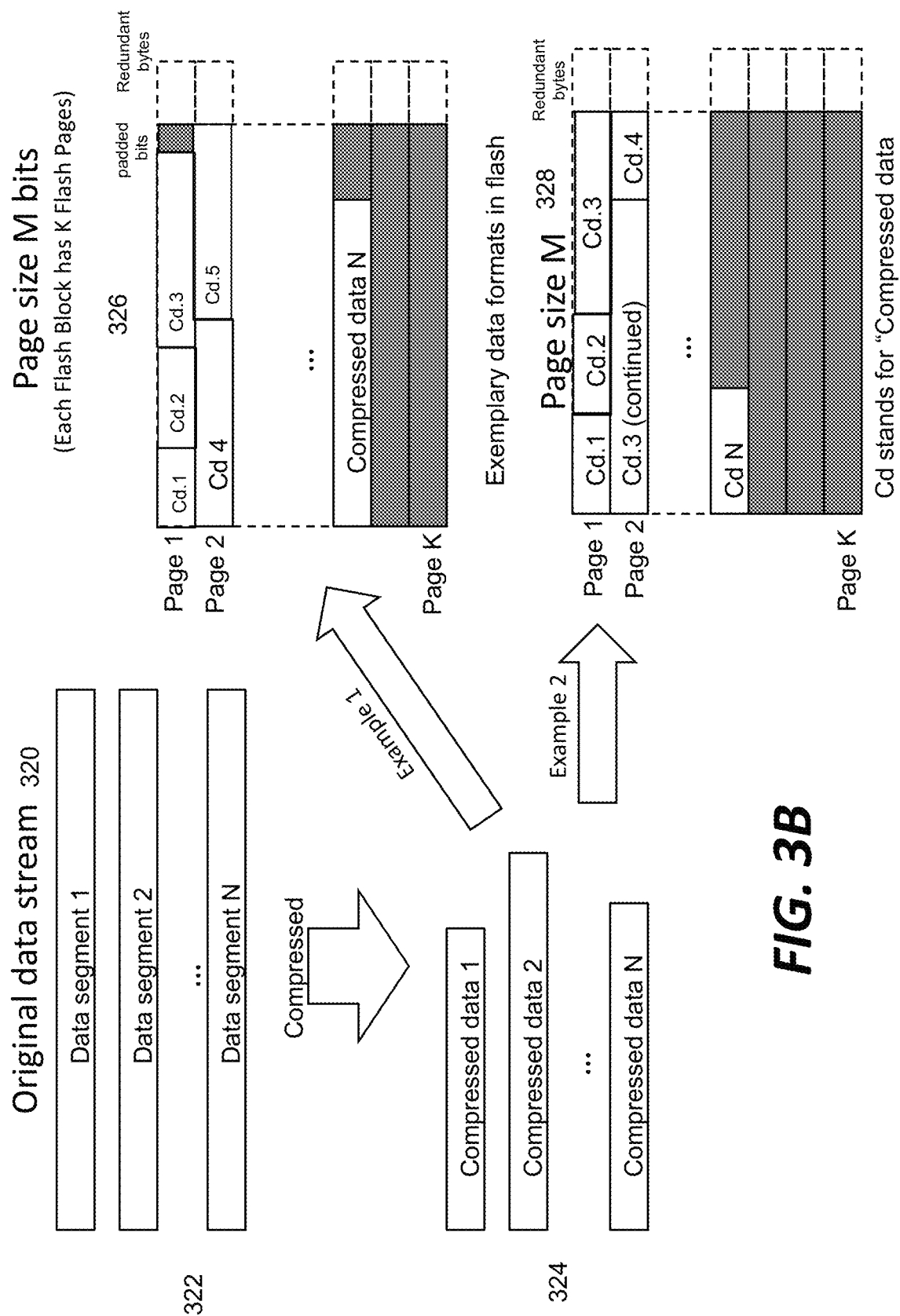
FIG. 3B shows how these data segments may be repackaged or readdressed in reference to a page with respect to an operation in FIG. 3A.

After data compression at 304, the compressed data segments are often different in lengths. Depending on how many there are successive repetitive bits in a sequence, lengths of compressed data sequences (referred to herein as data segments) are very different. In general, the more successive repetitive bits there are in a data sequence, the shorter a data segment is. At 306, when a two dimensional array of data packs is formed, two operations 307 and 308 are involved according to one embodiment. Referring now to FIG. 3B, it shows how these data segments may be repackaged or readdressed in reference to a page with respect to 307.

FIG. 3B shows that an incoming data stream 320 is viewed as a plurality of data sequences 322 that may be equal in length per a predefined protocol. After the data compression 304 of FIG. 3A, each of the data sequences 322 is compressed, the (compressed data) segments 324 are generally different in lengths. When writing the data segments 324 into a fixed page in a flash memory, with the redundant bits eventually from the ECC, any extra cells in a page shall be utilized before the process 300 of FIG. 3A can proceed.

According to one embodiment, each page in a flash memory shall accommodate as many of the data segments 324 as possible for maximum capacity. It is assumed one block of flash memory would be needed to accommodate these segments to form pages of data (e.g., K×M) from the compressed data segments 324, where K or M is an integer. It shall be noted that forming a page of data does not mean writing the data into a page of the flash memory at this stage. As described above, a page is the smallest unit in the flash memory that can be programmed (i.e., written therein), forming a page of data is just a preparation before the data is to be written into the flash. Depending on implementation, the preparation or preprocessing may be carried via a RAM or data accessing.

As shown in the array 326, after placing one segment (data segment 1 or Cd1) in a page (e.g., Page 1), there are extra spaces left in the page. Reserving a predefined number of spaces for the redundant bits from the ECC, the extra spaces in the page can be used to accommodate more segments Cd2 and Cd3 according to one embodiment (e.g., Example 1). After Cd2 and Cd3, there are still some spaces that are not enough to accommodate a next segment. These remaining spaces are filled with a series of known bits, for example, all "0"s or all "1"s. In other words, a page size is referenced to accommodate as many complete segments as possible. Any remaining spaces are filled with known bits. Similar operations are performed for the subsequent pages till all segments 324 are consumed. In general, a block includes a predefined number of pages. It is assumed that there are K pages in a block that is sufficient for all segments 324. Given the operation of concatenating as many complete segments as possible in a page, there can be a certain number of pages left in the block that are unfilled. According to one embodiment, these remaining pages are also filled with known bits. Should one block be not enough to accommodate all segments 324, a second block may have to be allocated. Similarly, any remaining unused pages are filled with known bits.

Figure 3C:
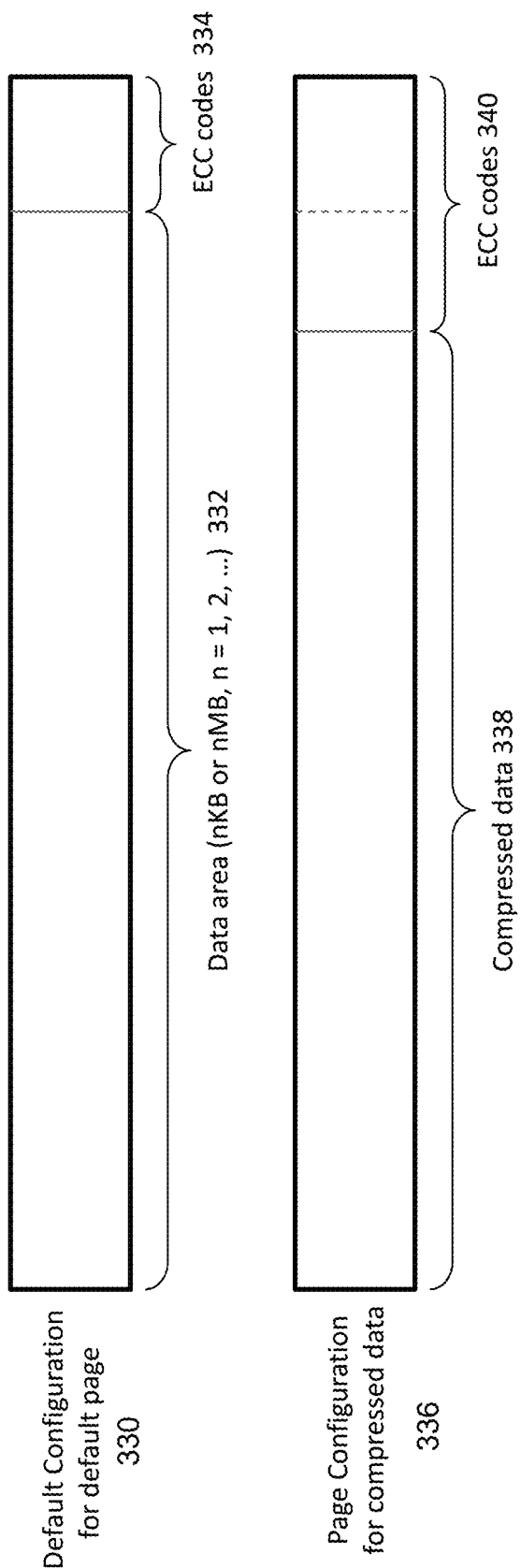
FIG. 3C shows an example of a default page configuration and a corresponding configuration from storing compressed data and extendable spaces for redundant bits.

Different manufacturers may produce flash memories with different sizes for a page. Usually a page size is given in terms of kilobyte (KB or 1024 B) or megabyte (MB or 1024 KB). For whatever reason, a page size is often slightly more than nKB or nMB (n is an integer), for example, 8.2 KB, where the extra bit capacity (200 bytes) is provided to store the ECC codes or the redundant codes from an ECC scheme. FIG. 3C shows an example of a default page configuration 330. It has a first data area 332 provided to store data and a second data area provided to store the ECC codes or redundant bits. Should more recovery capability be desired, more redundant codes would be needed. Storing the original data sequences directly into the page 330 would limit the recovery capability as the second data area is limited. With the compressed data, however, the data segments are generally shorter than the original data sequences, thus there are more available spaces in the first data area. These available spaces can be used to accommodate some of the ECC codes or redundant bits. In other words, the second data area can be expanded into the first data area. A corresponding page configuration for compressed data 336 is also shown in FIG. 3C. As the data to be stored in the page has been compressed, there are some unoccupied spaces in the first data area. As a result, the second data area may be expanded into the first data area as needed to increase the recovery (detection and correction) capability.

Returning to FIG. 3B, it also shows a second example in which a page accommodates only multiple data segments. In view of the first example, the second example allows a segment to be broken into two pieces, of which the first piece together with other complete segments are to fill up an entire page. In operation, a page is filled with several complete segments to take up most of the space of the page. Depending on how much space is left in the page, a subsequent segment is broken into two pieces, the first piece is used for any remaining of the page and the second piece is used to begin with the next page. The first page Page 1 in the block 328 is filled with two complete segments Cd 1 and Cd 2 but would have some space left unused. If the third segment Cd 3 is used directly, it would be too big for the remaining space in the page. According to the second example, the third segment Cd 3 is broken into two pieces according to the remaining space. Thus the first piece of the segment Cd 3 is cut just to fill the remaining space of Page 1. The second piece of the segment Cd 3, namely the remaining portion of the segment Cd 3, is used to fill Page 2 first, followed by complete segments. Essentially, most of the pages are filled with the segments 324. In the end, the remaining available pages in the block 328 is filled with known bits.

Figure 3D:
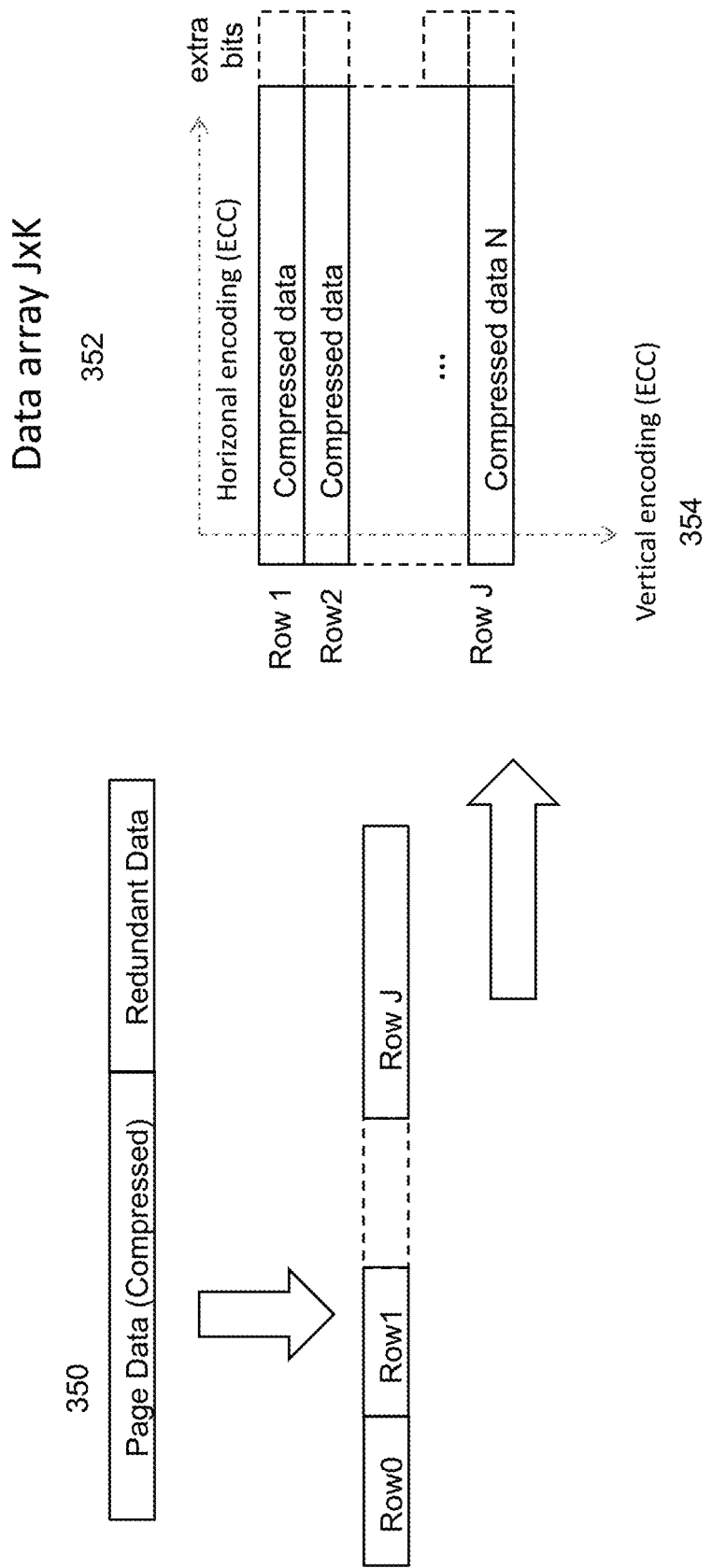
FIG. 3D shows how a two dimensional array of data packs is formed based on a page of data formed according to FIG. 3C with respect to an operation in FIG. 3A.

Referring now to FIG. 3D, it shows how a two dimensional array of data packs is formed based on a page of data formed according to FIG. 3C with respect to 308 of FIG. 3A. A page of data 350 including actual data (compressed) and reserved spaces for redundant data (bits) is to be formatted into an array of data packs. According to one embodiment, the data in the first data area is rearranged into two dimensions J×K, where J and K are predefined in accordance with the page size (or length). The reserved spaces for redundant bits are equally distributed to J rows. Each row is assigned a set of spaces for storing the redundant bits computed from an ECC operation applied to the row. Depending on the use of a particular ECC on a row of data, the number of spaces for the redundant bits is fixed or allocated in advance.

Referring now back to FIG. 3A, at 309, mapping tables are created or updated simultaneously at the time the two dimensional array of data packs are formed at 306 or right after. At 310, the predefined ECC is applied to rows of data or the data packs newly formed. In operation, the data bits are encoded and the redundant bits are computed. The data in the first data area and the redundant bits from the ECC are written into the flash memory (e.g., a page). The operation 310 is repeated for each row of the data in two dimensions or the operation 310 is carried simultaneously along one dimension for an entire block.

At 312, the process 300 goes back to 310 for another dimension. In one embodiment, the dimensions are assumed two, namely horizontal and vertical. Should the first pass be for the horizontal dimension, the second ECC operation is now applied vertically. The data packs are formed as described above. The horizontal encoding is performed across all data packs. The subtle difference along the vertical encoding is that the operation 310 is carried out across a data bit in each of the data pack formed horizontally. FIG. 3D shows a scanning line 354 to indicate a data bit in each of the data pack formed horizontally is used when reformatting a vertical data pack for encoding vertically.

Referring now back to FIG. 3A, the data packs (now essentially code words) are stored in the allocated spaces in a flash array and managed by mapping tables. Once the compressed data segments are encoded horizontally and vertically, the process 300 goes on 314 to finish writing the encoded and compressed data into the flash memory arrays.

FIG. 3E shows a flowchart or process 360 of detecting and correcting errors in stored data according to one embodiment of the present invention. The flowchart 360 may be better appreciated in view of FIGS. 2A-2D and FIG. 3A-3D, and implemented in hardware or in combination of software (e.g., firmware) and hardware. The flowchart 360 starts when there is a data request from a host device (e.g., a media player) for a file, data of which is stored in a flash memory array. Upon receiving the request, a flash controller is configured to check with mapping tables that may be stored in a separate memory (e.g., RAM) or the flash memory array. Given the mapping tables, the data for the requested file is located in the flash memory array and bits of the data are read out for error detections and corrections first before they are sent out to the host device.

As described above, one or more mapping tables are provided to facilitate the translation of a logical address from a file system to a physical address of flash memory. The mapping tables for stored data of the file were created or updated before the file was written or saved in the flash memory. At 364, the mapping tables (often stored in the flash memory) are accessed, from which data bits pertaining to the requested file are read out at 366. Some of the stored data bits may have been flipped or corrupted, for example "1" to "0" or "0" to "1".

At 368, these data bits are checked per the registered ECC to see if there are any errors. If there are some, depending on the number of errors, they can be readily detected and corrected. If the number of errors exceeds a threshold per the ECC, the errors cannot be corrected and an error message would be reported. It is assumed that the number of errors is under the threshold (e.g., 5 or 20 in a data pack or page). Thus possible errors in the read-out data bits are detected and corrected via the underling ECC procedure at 368 and 370. As described above, the ECC is applied in two dimensions and may be applied repeatedly to correct more errors or isolate one or more uncorrectable error groups or arrays for correction with extra effort (e.g., reduce the number of errors given the known values of the padded data and their locations in a data segment). According to another embodiment, all values in an uncorrectable matrix or arrays are reversed, the detail of which is described in commonly owned and co-pending U.S. application Ser. No. 16/827,192, which is hereby incorporated by reference.

At 372, all the known padded data bits are removed. As described above, the padded data bits are all known values. According to one embodiment, the locations of these padded data bits are also used to facilitate the correction of possible errors at some or all of these locations at 368 to further reduce the number of errors. It should be also noted that some of the padded data bits are used as parameters to indicate what is followed in a next page in the flash memory. When a data segment is broken into two or more pieces spreading over one or more data packs, some parameters or signs may be needed to indicate where is the next piece of the data segment to facilitate the recovery of the data segment from more than one data packs.

The data segments are read out and assumed that the correctable errors have been corrected. At 374, the compressed data segments are decompressed to recover the original data for the file being requested.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

What we claim:

1. An apparatus for storing compressed data, the apparatus comprising:
    an interface for receiving a data stream from a host device;
    a memory space for maintaining a set of firmware and one or more mapping tables;
    a processor, coupled to the memory space, executing the firmware to perform operations of:
        forming a plurality of data segments in equal lengths from the data stream:
        compressing the plurality of data segments in accordance with a compression algorithm, wherein the compressed data segments are in different lengths;
        forming a plurality of data packs in a predefined length, each of the data packs accommodating one or more of the compressed data Segments in entirety and filled with known bits after a space of predefined length is reserved to complete the each of the data packs, wherein the data packs are in two dimensions; and
        encoding each of the data packs with a first predefined Error Correcting Code (ECC) scheme along a first dimension.

2. The apparatus recited in claim 1, wherein the operations further include:
    encoding each of data bits across each of the data packs with a second predefined ECC scheme along a second dimension; and
    creating an array of data including the data packs along with redundant bits from the first predefined ECC and the second predefined ECC.

3. The apparatus as recited in claim 2, wherein the first predefined ECC is identical to the second predefined ECC.

4. The apparatus as recited in claim 1, wherein said forming a plurality of data packs in a predefined length comprises:
    reserving the space for storing redundant bits defined by the first predefined ECC scheme; and
    padding a series of data bits in known values to the one or more of the compressed data segments in entirety in the each of data packs to satisfy the predefined first length including the redundant bits.

5. The apparatus as recited in claim 4, wherein locations of the padded data bits are predetermined and used to detect and correct errors introduced to the padded data bits when the compressed data segments are retrieved flash memory.

6. The apparatus as recited in claim 4, wherein the data pack includes at least one compressed data segment, the redundant bits defined by the first predefined ECC scheme and the padded data bits.

7. The apparatus as recited in claim 6, the operations further include:
    maintaining one or more map tables to record where the data packs, the redundant bits defined by the first predefined ECC scheme and the padded data bits are physically located.

8. The apparatus as recited in claim 1, wherein said forming a plurality of data packs comprises:
    adding the compressed data segments sequentially into the data packs; and
    breaking a compressed data segment into at least two pieces, one of the at least two pieces used to fill in remaining spaces in a data pack when a previous compressed data segment is not long enough to satisfy the predefined first length including the redundant bits.

9. The apparatus as recited in claim 8, the operations further include: maintaining one or more map tables to record how the compressed data segment is broken into at least two pieces, where the data packs are, and the redundant bits defined by the first predefined ECC scheme.

10. The apparatus as recited in claim 9, wherein the data pack, the redundant bits from the first predefined ECC are included in a page of a flash memory array in accordance with predefined size of the page.

11. A method for storing compressed data, the method comprising:
  receiving a data stream from an interface communicating with a host device;
  forming a plurality of data segments it equal lengths from the data stream;
  compressing the data segments into a plurality of compressed data segments in accordance with a compression algorithm, wherein the data segments are in different lengths;
  forming a plurality of data packs in a predefined length, each of the data packs accommodating one or more of the compressed data segments in entirety and filled with known bits after a space of predefined length is reserved to complete the each of the data packs, wherein the data packs are in two dimensions; and
  encoding each of the data packs with a first predefined Error Correcting Code (ECC) scheme along a first dimension.

12. The method as recited in claim 11, further comprising:
  encoding each of data bits across each of the data packs with a second predefined ECC scheme along a second dimension
  creating an array of data including the data packs along with redundant bits from the first predefined ECC and the second predefined ECC.

13. The method as recited in claim 12, wherein the first predefined ECC is identical to the second predefined ECC.

14. The method as recited in claim 11, wherein said forming a plurality of data packs in a predefined length comprises:
  reserving the space for storing redundant bits defined by the first predefined ECC scheme; and
  padding a series of data bits in known values to the one or more of the compressed data segments in entirety to satisfy the predefined length including the redundant bits.

15. The method as recited in claim 14, wherein locations of the padded data bits are predetermined and used to detect and correct errors introduced to the padded data bits when the compressed data segments are retrieved.

16. The method as recited in claim 14, wherein the data pack includes at least one compressed data segment, the redundant bits defined by the first predefined ECC scheme and the padded data bits.

17. The method as recited in claim 16, further comprising:
  maintaining one or more map tables to record where the data packs, the redundant bits defined by the first predefined ECC scheme and the padded data bits are physically located.

18. The method as recited in claim 11, wherein said forming a plurality of data packs comprises:
  adding the compressed data segments sequentially into the data packs; and
  breaking a compressed data segment into at least two pieces, one of the at least two pieces used to fill in remaining spaces in a data pack when a previous compressed data segment is not long enough to satisfy the predefined first length including the redundant bits.

19. The method as recited in claim 18, further comprising:
  maintaining one or more map tables to record how the compressed data segment is broken into at least two pieces, where the data packs are, and the redundant bits defined by the first predefined ECC scheme.

20. The method as recited in claim 19, wherein the data pack, the redundant bits from the first predefined ECC are included in a page of a flash memory array in accordance with predefined size of the page.

* * * * *